United States Patent [19]

Veburg

[11] 4,148,534
[45] Apr. 10, 1979

[54] ELECTRICAL RESISTOR TESTING CHAMBER

[75] Inventor: John C. Veburg, Columbus, Nebr.

[73] Assignee: Dale Electronics, Inc., Columbus, Nebr.

[21] Appl. No.: 795,136

[22] Filed: May 9, 1977

[51] Int. Cl.² .................. A47B 77/08; G01R 31/00
[52] U.S. Cl. ............................. 312/236; 312/263; 312/257 SK; 361/384; 324/158 F; 174/16 R; 62/382
[58] Field of Search .......... 312/263, 236, 301, 257 SK, 312/257 SM; 361/384; 62/382, 418; 174/16 R; 324/158 F

[56] References Cited

U.S. PATENT DOCUMENTS

| | | | |
|---|---|---|---|
| 1,922,456 | 8/1933 | Powell | 62/382 |
| 2,506,448 | 5/1950 | Gregor | 62/382 |
| 2,843,806 | 7/1958 | O'Neill | 174/16 R |
| 3,019,620 | 2/1962 | Costantini et al. | 62/418 |
| 3,192,306 | 6/1965 | Skonnord | 312/236 |
| 3,387,648 | 6/1968 | Ward, Jr. et al. | 361/384 |
| 3,626,251 | 12/1971 | Vigue | 361/384 |
| 3,656,058 | 4/1972 | Leathers | 324/158 F |

*Primary Examiner*—Victor N. Sakran
*Attorney, Agent, or Firm*—Zarley, McKee, Thomte, Voorhees & Sease

[57] ABSTRACT

A testing chamber is generally comprised of a support structure, drawers for holding the modular test trays, timer, power supplies, and air blower. The support structure supports a plurality of drawers in horizontal position with the drawers supporting a plurality of test trays in a horizontal, parallel alignment. When a particular test allows air flow, air is blown into the plenum of the support structure, and passes through outlets of the support structure and into mating air inlets of the plena of the drawers. Flapper valves provide control of the air flow at the support structure outlets. The air then passes through a diffusing medium covering the slots of the drawers and up through air passages in the test tray such that there is no direct impingement of air on the components mounted on the modules. The diffusing medium maintains the air flow through the slots of the drawers at a uniform velocity whether test trays are present or not.

A principal object of this invention is to provide the testing chamber which will accommodate a modular test tray for electrical resistors or the like which allows for a pressure chamber so that air can flow up between the units taking away heat and yet not allowing direct impingement of air on the components to be tested. A still further object of the invention is to provide a testing chamber capable of providing uniform velocity air flow to the components to be tested.

10 Claims, 10 Drawing Figures

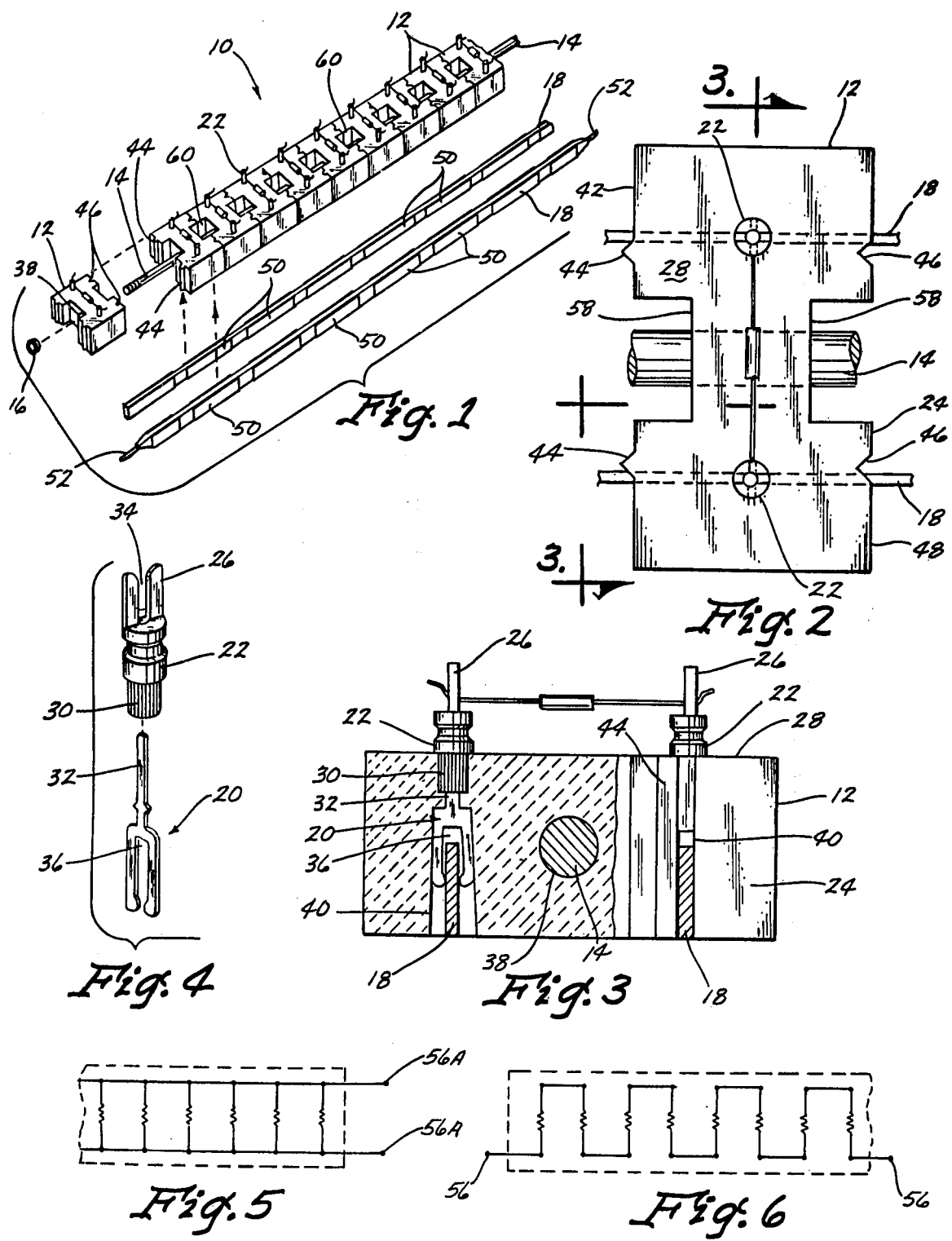

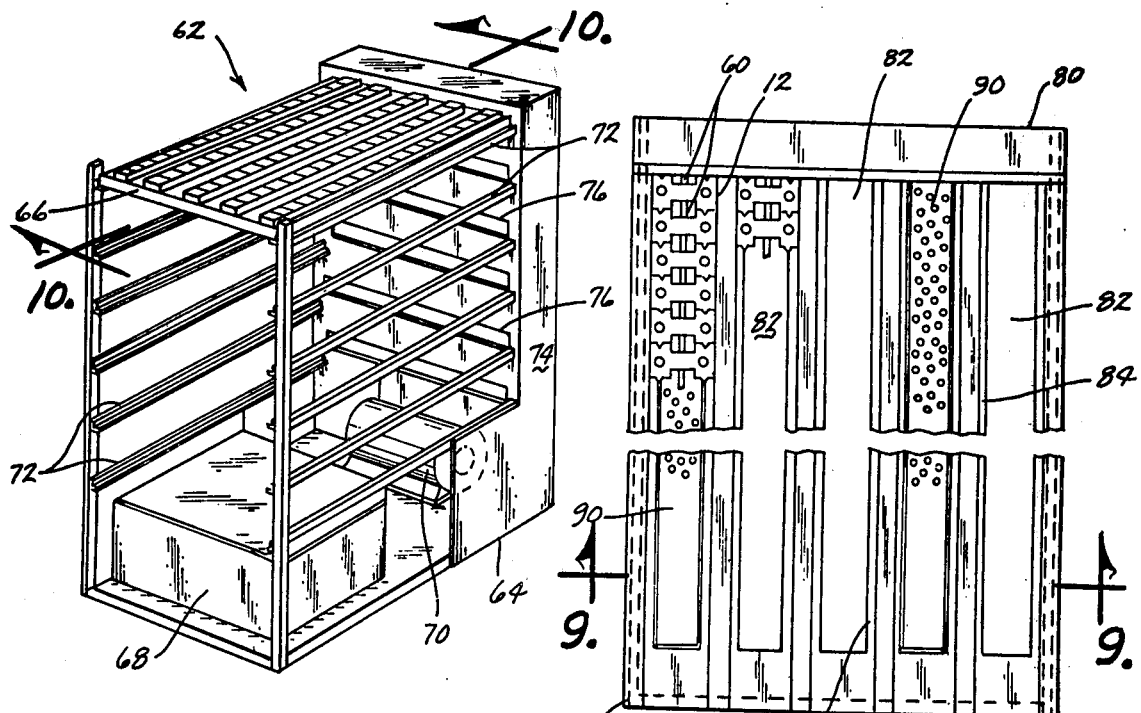
Fig. 7
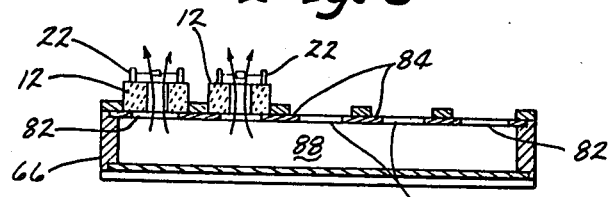
Fig. 8
Fig. 9
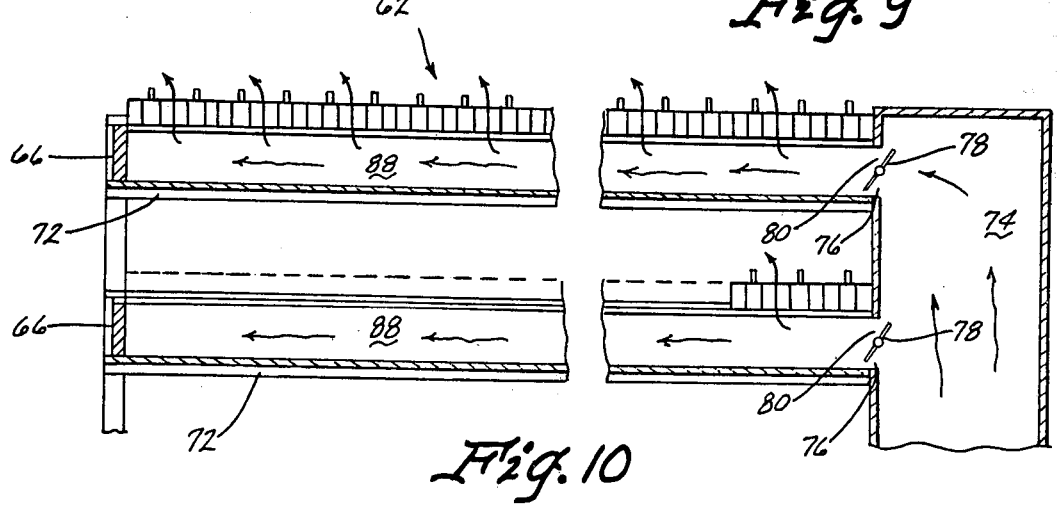
Fig. 10

ELECTRICAL RESISTOR TESTING CHAMBER

BRIEF SUMMARY OF THE INVENTION

A modular test tray and testing chamber are disclosed. The modular test tray is comprised of individual modules detachably mounted for variance of the tray size and easy replacement of worn out modules. Individual modules are comprised of embedded tuning fork shaped connector pins electrically connected to embedded posts capable of receiving the components to be tested. The connector pins detachably receive shorting straps and allow reading of all units on a tray in a matter of seconds without unmounting the components from the tray. Shorting straps allow parallel and series electrical connection of the components to be tested. Rigid attachment of the modules allow the tray to be used for shock and vibration tests and allows positive transfer of energy, in addition to electrical tests.

The testing chamber is disclosed wherein the chamber is comprised of drawers for supporting a plurality of test trays in horizontal parallel alignment. The testing chamber includes a timer, power supplies, air blower, and support structure capable of supporting the drawers and controlling and guiding the air flow from the blower to the test trays. A flapper valve controls the air flow from the support structure to the plena of the drawers. A diffusing medium covering the slots of the drawers directly beneath the test trays provides uniform velocity of air flow and non-impingement of air on the components.

BRIEF DESCRIPTION OF THE DRAWINGS

FIG. 1 is a partially exploded perspective view of the modular test tray.

FIG. 2 is an enlarged top view of an individual test tray module.

FIG. 3 is an enlarged sectional view seen on line 3—3 of FIG. 2.

FIG. 4 is an enlarged perspective view of a connector pin and post.

FIG. 5 is a schematic view of the modular test tray in a parallel mode.

FIG. 6 is a schematic view of the modular test tray in a series mode.

FIG. 7 is a perspective view of the testing chamber.

FIG. 8 is a partial top view of the testing chamber drawer and modular test trays.

FIG. 9 is a sectional view seen on line 9—9 of FIG. 8 illustrating air flow.

FIG. 10 is a partial sectional view seen on line 10—10 of FIG. 7 illustrating air flow.

DESCRIPTION OF THE PREFERRED EMBODIMENT

The modular test tray 10 is generally comprised of a plurality of individual modules 12, bolt 14, nuts 16 and shorting straps 18.

Module 12 is comprised of "tuning fork" connector pins 20, component posts 22 and insulating body 24. Connector pin 20 and post 22 are electrically connected and vertically embedded in body 24 with the upper portion 26 of component post 22 protruding from the surface 28 of body 24.

Post 22 has a tuning fork shaped upper portion 26 and a cylindrical shaped bottom portion 30 for slidably engaging the stem 32 of connector pin 20. Posts 22 are embedded in body 24 such that the grooves 34 of upper portion 26 are laterally aligned to receive and electrically connect to the components to be tested as shown in FIGS. 1 and 3. Connector pins 20 are embedded in body 24 such that grooves 36 of connector pins 20 of adjoining modules 12 are longitudinally aligned to receive and electrically connect to shorting straps 18.

Module 12 has a longitudinal circular aperture 38 for receiving bolt 14 and longitudinal grooves 40 for receiving shorting straps 18. The front edge 42 of modules 12 is provided with tongues 44 to engage the grooves 46 provided on the back edge 48 of adjoining modules 12 in a tongue and groove fashion, such that circular apertures 38 are in longitudinal alignment to receive bolt 14 and grooves 40 are in longitudinal alignment to receive shorting straps 18. A plurality of modules 12 are aligned in tongue and groove fashion as shown in FIG. 1 with the tongues 44 engaging the grooves 46 of the adjoining modules 12. The plurality of modules 12 are securely joined together by apertures 38 receiving bolt 14 and nuts 16 threadably engaging each end of bolt 14 to form a rigid solid test tray. Grooves 40 are longitudinally aligned to receive shorting straps 18 which are in turn received by connector pin groove 36 such that shorting straps 18 are securely held by and electrically connected to connector pin 20 as shown in FIG. 3. Front edge 42 and back edge 48 are provided with recesses 58 such that air flow openings 60 are formed when the modules 12 are joined together as a tray as shown in FIG. 1.

The shorting straps 18, shown in FIG. 1, are constructed of stiff electrically insulating material with intermittent strips 50 of electrical conducting material. Strips 50 are of sufficient length to electrically connect only two connector pins 20 of adjoining modules 12 and are spaced so as to electrically connect consecutive pairs of connector pins 20. Lead wires 52 are electrically connected to each end of only one strap 18 as shown in FIG. 1. If an uneven number of resistors were being tested, the leads 52 would be connected to one end of strap 18 and to the opposite end of the other strap 18. Shorting straps 18 are inserted in tray 10 such that each strap 18 connects consecutive non-opposite pairs of connector pins 20 to produce a series electrical connection of the components to be tested as shown in the schematic diagram of FIG. 6.

An alternate form of shorting strap is constructed such that strips 50 are adjoining rather than spaced apart so as to form one continuous electrical conducting strip whereby insertion of the strap into test tray 10 electrically connects all the connector pins 20 on one side of tray 10. Lead wires are electrically connected to one end of each shorting strap. When both shorting straps are inserted into tray 10, a parallel electrical connection of the components to be tested is produced as shown in the schematic diagram of FIG. 5.

In operation, the components to be tested are inserted in grooves 34 of posts 22 of modules 12 as shown in FIG. 1. If a series test is to be made, shorting straps 18 are inserted in grooves 40 of modules 12 and in turn into grooves 36 of connector pins 20. The components to be tested are now electrically connected in a series configuration as shown in FIG. 6. Points 56 in FIG. 6 correspond electrically to lead wires 52. The test equipment is then connected to lead wires 52.

Similarly, if a parallel test is to be made, the alternate form of shorting straps are likewise inserted in test tray 10 and the components to be tested are thereby electrically connected in a parallel configuration as shown in FIG. 5. Points 56A in FIG. 5 correspond electrically to the lead wires attached to the alternate form of shorting straps. The test equipment is then connected to the lead wires.

Since the tray is solidly connected, it can also be used for shock and vibration tests. Easy access to the connector pins 20 also facilitates scanner reading in that all units on a tray can be read in a matter of seconds without unmounting from the tray.

Test tray 10 is easily and quickly dismantled by disengaging nuts 16 and bolt 14 allowing variance of the tray sizes to accommodate multiple lot sizes and value splits. Worn out portions of the tray may be discarded while still maintaining the balance of the tray that is operational.

Testing chamber 62 is generally comprised of support structure 64, drawers 66, timer (not shown) power supplies 68 and air blower 70.

Support structure 64 as shown in FIG. 7 is comprised of drawer slides 72 for receiving and supporting a plurality of drawers 66, plenum 74, air flow openings 76 and flapper valve 78. Plenum 74 is enclosed except for air flow openings 76.

Drawer 66 supports test trays 12 in slots 84 in horizontal parallel alignment as shown in FIGS. 7 and 8. Drawer 66 is enclosed except for air flow inlet 80 at one end of drawer 66 (as shown in FIG. 10), and air flow exits 82 on the top surface of drawer 66 directly beneath test tray 10 as shown in FIGS. 8 and 9. Diffusing medium 90 is a sheet having a plurality of apertures and covers air flow exits 82.

Test trays 10 are placed in slots 84 of drawer 66 directly above air flow exits 82. Drawer 66 is placed on drawer slides 72 and pushed into support structure 64 until meeting plenum 74. Air flow inlet 80 is in direct alignment with air flow openings 76 as shown in FIG. 10.

Blower 70 discharges air into plenum 74. The air is forced out of air flow openings 76, through air flow inlet 80 into the plenum 88 of drawer 66 as shown in FIG. 10. Flapper valve 78 provides control of the amount of air that enters each drawer. The air then escapes through diffusing medium 90 and air flow exits 82 of drawer 66 and up through air flow openings 60 of test trays 10 such that there is no direct air impingement on the components mounted on the modules 12. The diffusing medium maintains the air flow through the air flow exits 82 at a uniform velocity all along exit 82 whether test trays are present or not.

Thus, it can be seen that the testing chamber accomplishes at least all of its stated objectives.

What is claimed is:

1. A testing chamber for testing electrical components comprising,
   at least one drawer having means for supporting electrical components said drawer having a top portion with slots therein to allow air flow, a first plenum beneath said slots, and an air inlet to said first plenum at one end of said drawer to receive air flow, a support structure to support said drawers, and means to provide uniform velocity, non-direct air impingement to said electrical components.

2. The device of claim 1 wherein the support structure slidably supports said drawers in vertical alignment with the drawers being horizontally parallel to each other.

3. The device of claim 2 wherein the drawer comprises a plurality of grooves above said slots for receivably supporting test trays in a horizontally parallel alignment.

4. The device of claim 1 wherein a diffusing means covers said slots for maintaining uniform velocity of air flow through said slots.

5. The device of claim 4 wherein said diffusing means comprises a sheet containing a plurality of apertures.

6. The device of claim 5 wherein the support structure comprises a second plenum for receiving air flow having air outlets meeting said air inlets of said drawers.

7. The device of claim 6 wherein a valve means is provided at said second plenum air outlet for regulating air flow through said outlet.

8. The device of claim 7 wherein an air blower and electrical power supply are provided in said support structure.

9. The device of claim 1 wherein said means to provide uniform velocity, non-direct air impingement to said electrical components comprises,
   air blower means,
   passageway means having an outlet area for guiding air from said air blower means to said outlet area, said outlet area being remote from said electrical components, and
   diffusing means attached to said outlet area.

10. The device of claim 9 wherein said outlet area is located laterally remote from said electrical components.

* * * * *